US010866859B1

(12) United States Patent
Kuo

(10) Patent No.: US 10,866,859 B1
(45) Date of Patent: Dec. 15, 2020

(54) NON-VOLATILE MEMORY ACCESSING METHOD USING DATA PROTECTION WITH AID OF LOOK-AHEAD PROCESSING, AND ASSOCIATED APPARATUS

(71) Applicant: Silicon Motion Inc., Hsinchu County (TW)

(72) Inventor: Shiuan-Hao Kuo, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 27 days.

(21) Appl. No.: 16/423,177

(22) Filed: May 28, 2019

(51) Int. Cl.
*G06F 11/10* (2006.01)
*G11C 29/52* (2006.01)
*H03M 13/29* (2006.01)
*G06F 3/06* (2006.01)

(52) U.S. Cl.
CPC ........ *G06F 11/1068* (2013.01); *G06F 3/0619* (2013.01); *G06F 3/0659* (2013.01); *G06F 3/0679* (2013.01); *G11C 29/52* (2013.01); *H03M 13/2906* (2013.01)

(58) Field of Classification Search
CPC .. G06F 11/1068; G06F 3/0619; G06F 3/0659; G06F 3/0679; G11C 29/52; H03M 13/2906
USPC ......................... 714/755, 757, 763, 768, 773
See application file for complete search history.

(56) References Cited

U.S. PATENT DOCUMENTS

| | | | |
|---|---|---|---|
| 8,972,824 B1* | 3/2015 | Northcott | G06F 11/108 714/773 |
| 9,009,565 B1* | 4/2015 | Northcott | G06F 11/108 714/763 |
| 9,021,336 B1* | 4/2015 | Northcott | G06F 11/108 714/773 |
| 9,021,337 B1* | 4/2015 | Northcott | G06F 11/108 714/773 |
| 9,026,867 B1* | 5/2015 | Northcott | G11C 29/42 714/704 |
| 2011/0307758 A1* | 12/2011 | Fillingim | G06F 11/1048 714/758 |
| 2015/0012794 A1* | 1/2015 | Losh | G06F 11/1048 714/755 |
| 2015/0178155 A1* | 6/2015 | Kim | G11C 11/419 714/758 |
| 2016/0110252 A1* | 4/2016 | Hyun | G06F 11/1044 714/766 |

(Continued)

*Primary Examiner* — John J Tabone, Jr.
(74) *Attorney, Agent, or Firm* — Winston Hsu

(57) ABSTRACT

A non-volatile (NV) memory accessing method using data protection with aid of look-ahead processing, and associated apparatus such as memory device, controller and encoding circuit thereof are provided. The NV memory accessing method may include: receiving a write command and data from a host device; obtaining at least one portion of data to be a plurality of messages, to generate a plurality of parity codes through look-ahead type encoding, wherein regarding a message: starting encoding a first partial message to generate a first encoded result; applying predetermined input response information to a second partial message to generate a second encoded result, and combining the first and the second encoded results to generate a first partial parity code; and starting encoding the message to generate a second partial parity code, and outputting the first and the second partial parity codes to generate a parity code; and writing into the NV memory.

20 Claims, 8 Drawing Sheets

(56) References Cited

U.S. PATENT DOCUMENTS

2016/0283321 A1\* 9/2016 Yang .................. G06F 11/1012
2020/0119754 A1\* 4/2020 Kim .................. H03M 13/2906

\* cited by examiner

NON-VOLATILE MEMORY ACCESSING METHOD USING DATA PROTECTION WITH AID OF LOOK-AHEAD PROCESSING, AND ASSOCIATED APPARATUS

BACKGROUND OF THE INVENTION

1. Field of the Invention

The present invention is related to memory control, and more particularly, to a non-volatile (NV) memory accessing method using data protection with aid of look-ahead processing, and associated apparatus such as a memory device, a controller of the memory device, and an encoding circuit of the controller.

2. Description of the Prior Art

Developments in memory technology have enabled the wide application of various portable and non-portable memory devices (e.g. memory cards conforming to the SD/MMC, CF, MS, XD or UFS specifications, solid state drives (SSDs), embedded storage devices conforming to the UFS or EMMC specifications, etc.). Improving access control of memories in these memory devices remains an issue to be solved in the art.

NAND flash memories may comprise single level cell (SLC) and multiple level cell (MLC) flash memories. In an SLC flash memory, each transistor used as a memory cell may have either of two electrical charge values respectively corresponding to logical values 0 and 1. In comparison, the storage ability of each transistor used as a memory cell in an MLC flash memory may be fully utilized. The transistor in the MLC flash memory can be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in memory devices than an SLC flash memory. The MLC flash memory does have instability issues, however. To ensure that access control of the flash memory in the memory device meets required specifications, a controller of the flash memory may be equipped with some management mechanisms for properly managing data access.

Even memory devices with the above management mechanisms may have certain deficiencies, however. For example, during a certain type of encoding in error correction code (ECC) processing, the calculation of the associated matrix multiplication cannot be performed until all the messages have been inputted into the encoder, which may cause an encoding delay such as a delay time between a start time point of the matrix multiplication and a later time point of obtaining the first result from the matrix multiplication. In addition, there may be vacancy (e.g. lack of data) on a path of the data transfer within the hardware architecture. Some suggestions are proposed in the related art, in order to try solving the above problems. However, some side effects may be introduced. For example, the circuitry may need to be divided into multiple stages to wait for one another. In some examples, the circuit architecture may become much more complicated. Hence, there is a need for a novel method and associated architecture to improve the performance of the memory device without introducing aside effect or in a way that is less likely to introduce a side effect.

SUMMARY OF THE INVENTION

It is an objective of the present invention to provide a non-volatile (NV) memory accessing method using data protection with aid of look-ahead processing, and associated apparatus such as a memory device, a controller of the memory device, and an encoding circuit of the controller, in order to solve the above-mentioned problems.

It is another objective of the present invention to provide an NV memory accessing method using data protection with aid of look-ahead processing, and associated apparatus such as a memory device, a controller of the memory device, and an encoding circuit of the controller, in order to achieve optimal performance of the memory device.

At least one embodiment of the present invention provides an NV memory accessing method using data protection with aid of look-ahead processing, where the NV memory accessing method is applicable to a memory controller of a memory device. The memory device may comprise the memory controller and the NV memory, and the NV memory may comprise at least one NV memory element (e.g. one or more NV memory elements). The NV memory accessing method may comprise: utilizing the memory controller to receive a write command and data corresponding the write command from a host device; utilizing an encoding circuit of the memory controller to obtain at least one portion of data within the data corresponding the write command to be a plurality of messages of an error correction code (ECC) chunk, to generate a plurality of parity codes of the ECC chunk according to the plurality of messages through look-ahead type encoding, wherein the plurality of parity codes correspond to the plurality of messages, respectively, for protecting the plurality of messages, respectively; and utilizing the memory controller to write the ECC chunk comprising the plurality of messages and the plurality of parity codes into the NV memory. For example, regarding any message within the plurality of messages, the look-ahead type encoding may comprise: after a first partial message of the message is sent into the encoding circuit, starting encoding the first partial message to generate a first encoded result; after a second partial message of the message is sent into the encoding circuit, applying predetermined input response information to the second partial message to generate a second encoded result, and combining the first encoded result and the second encoded result to generate a first partial parity code of a parity code corresponding to the message; and after the message is fully sent into the encoding circuit, starting encoding the message to generate a second partial parity code of the parity code corresponding to the message, and outputting the first partial parity code and the second partial parity code to generate the parity code corresponding to the message.

In addition to the above method, the present invention also provides a memory device, and the memory device comprises a NV memory and a memory controller. The NV memory is arranged to store information, wherein the NV memory may comprise at least one NV memory element (e.g. one or more NV memory elements). The memory controller is coupled to the NV memory, and the memory controller is arranged to control operations of the memory device. In addition, the memory controller comprises a processing circuit, and the processing circuit is arranged to control the memory controller according to a plurality of host commands from a host device to allow the host device to access the NV memory through the memory controller. The memory controller further comprises a control logic circuit that is coupled to the processing circuit and arranged to control the NV memory. More particularly, the control logic circuit comprises an encoding circuit that is arranged to perform encoding with aid of look-ahead processing for data protection during accessing the NV memory. Additionally, the memory controller receives a write command and data corresponding the write command from the host device; the encoding circuit obtains at least one portion of data within the data corresponding the write command to be a plurality of messages of an ECC chunk, to generate a plurality of parity codes of the ECC chunk according to the plurality of messages through look-ahead type encoding, wherein the plurality of parity codes correspond to the plurality of messages, respectively, for protecting the plurality of messages, respectively; and the memory controller writes the ECC chunk comprising the plurality of messages and the plurality of parity codes into the NV memory. For example, regarding any message within the plurality of messages, operations of the look-ahead type encoding may comprise: after a first partial message of the message is sent into the encoding circuit, the encoding circuit starts encoding the first partial message to generate a first encoded result; after a second partial message of the message is sent into the encoding circuit, the encoding circuit applies predetermined input response information to the second partial message to generate a second encoded result, and combines the first encoded result and the second encoded result to generate a first partial parity code of a parity code corresponding to the message; and after the message is fully sent into the encoding circuit, the encoding circuit starts encoding the message to generate a second partial parity code of the parity code corresponding to the message, and outputs the first partial parity code and the second partial parity code to generate the parity code corresponding to the message.

In addition to the above method, the present invention also provides a memory controller of a memory device, where the memory device comprises the memory controller and an NV memory. The NV memory may comprise at least one NV memory element (e.g. one or more NV memory elements). In addition, the memory controller comprises a processing circuit, and the processing circuit is arranged to control the memory controller according to a plurality of host commands from a host device, to allow the host device to access the NV memory through the memory controller. The memory controller further comprises a control logic circuit that is coupled to the processing circuit and arranged to control the NV memory. More particularly, the control logic circuit comprises an encoding circuit that is arranged to perform encoding with aid of look-ahead processing for data protection during accessing the NV memory. Additionally, the memory controller receives a write command and data corresponding the write command from the host device; the encoding circuit obtains at least one portion of data within the data corresponding the write command to be a plurality of messages of an ECC chunk, to generate a plurality of parity codes of the ECC chunk according to the plurality of messages through look-ahead type encoding, wherein the plurality of parity codes correspond to the plurality of messages, respectively, for protecting the plurality of messages, respectively; and the memory controller writes the ECC chunk comprising the plurality of messages and the plurality of parity codes into the NV memory. For example, regarding any message within the plurality of messages, operations of the look-ahead type encoding may comprise: after a first partial message of the message is sent into the encoding circuit, the encoding circuit starts encoding the first partial message to generate a first encoded result; after a second partial message of the message is sent into the encoding circuit, the encoding circuit applies predetermined input response information to the second partial message to generate a second encoded result, and combines the first encoded result and the second encoded result to generate a first partial parity code of a parity code corresponding to the message; and after the message is fully sent into the encoding circuit, the encoding circuit starts encoding the message to generate a second partial parity code of the parity code corresponding to the message, and outputs the first partial parity code and the second partial parity code to generate the parity code corresponding to the message.

In addition to the above method, the present invention also provides an encoding circuit of a memory controller of a memory device, where the memory device comprises the memory controller and an NV memory, the memory controller comprises the encoding circuit, and the NV memory comprises at least one NV memory element (e.g. one or more NV memory elements). The encoding circuit comprises: a control circuit; a message input terminal; a switching circuit that is coupled to the message input terminal and the control circuit; a first encoder that is coupled to the switching circuit; a look-ahead circuit that is coupled to the switching circuit; a combining circuit that is coupled to the first encoder and the look-ahead circuit; a second encoder that is coupled to the message input terminal; and an output circuit that is coupled to the combining circuit and the second encoder. The control circuit is arranged to control the encoding circuit to perform encoding with aid of look-ahead processing for data protection during accessing the NV memory. The memory controller receives a write command and data corresponding the write command from a host device, and the encoding circuit obtains at least one portion of data within the data corresponding the write command to be a plurality of messages of an ECC chunk, to generate a plurality of parity codes of the ECC chunk according to the plurality of messages through look-ahead type encoding, wherein the plurality of parity codes correspond to the plurality of messages, respectively, for protecting the plurality of messages, respectively. In addition, the message input terminal is arranged to receive any message within the plurality of messages, and the switching circuit is arranged to perform switching under control of the control circuit, to divide the message within the plurality of messages into a first partial message and a second partial message. After the first partial message of the message is sent into the encoding circuit, the first encoder starts encoding the first partial message to generate a first encoded result. After the second partial message of the message is sent into the encoding circuit, the look-ahead circuit applies predetermined input response information to the second partial message to generate a second encoded result. The combining circuit is arranged to combine the first encoded result and the second encoded result to generate a first partial parity code of a parity code corresponding to the message. After the message is fully sent into the encoding circuit, the second encoder starts encoding the message to generate a second partial parity code of the parity code corresponding to the message. Under control of the control circuit, the output circuit outputs the first partial parity code and the second partial parity code to generate the parity code corresponding to the message. Additionally, the memory controller writes the ECC chunk comprising the plurality of messages and the plurality of parity codes into the NV memory.

The present invention method and associated apparatus can guarantee that the memory device can operate properly in various situations without encountering the related art problems. For example, the NV memory accessing method provides multiple control schemes for access control. With aid of the present invention method and associated apparatus, the memory device will not suffer from the existing problems of the related art, such as the encoding delay problem, the vacancy problem, etc.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
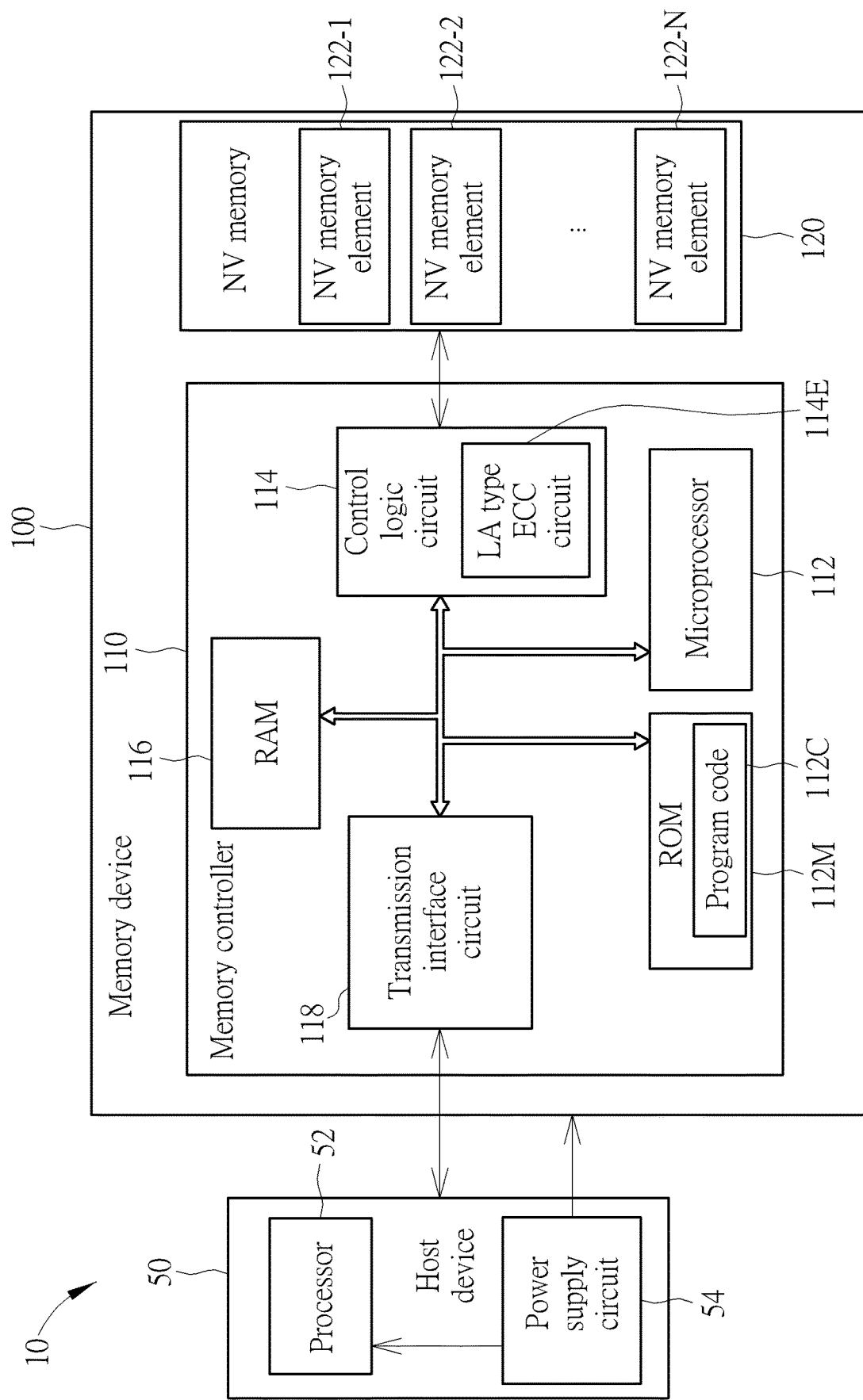
FIG. 1 is a diagram of an electronic system according to an embodiment of the present invention, where the electronic system may comprise a host device and a memory device.

FIG. 1 is a diagram of an electronic system 10 according to an embodiment of the present invention, where the electronic system 10 may comprise a host device 50 and a memory device 100. The host device 50 may comprise at least one processor (e.g. one or more processors) which may be collectively referred to as the processor 52, and may further comprise a power supply circuit 54 that is coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and an embedded storage device such as that conforming to Universal Flash Storage (UFS) or embedded MMC (eMMC) specifications. According to this embodiment, the memory device 100 may comprise a memory controller 110 and a non-volatile (NV) memory 120, where the memory controller 110 is arranged to control operations of the memory device 100 and access the NV memory 120, and the NV memory 120 is arranged to store information. The NV memory 120 may comprise at least one NV memory element (e.g. one or more NV memory elements), such as a plurality of NV memory elements 122-1, 122-2, . . . , and 122-N, where "N" may represent a positive integer that is greater than one. For example, the NV memory 120 may be a flash memory, and the plurality of NV memory elements 122-1, 122-2, . . . , and 122-N may be a plurality of flash memory chips or a plurality of flash memory dies, but the present invention is not limited thereto.

As shown in FIG. 1, the memory controller 110 may comprise a processing circuit such as a microprocessor 112, a storage unit such as a read-only memory (ROM) 112M, a control logic circuit 114, a random access memory (RAM) 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the NV memory 120. Note that, in some examples, the program code 112C may be stored in the RAM 116 or any type of memory. Further, the control logic circuit 114 may comprise a data protection circuit such as a look-ahead type error correction code (ECC) circuit 114E (labeled "LA type ECC circuit" in FIG. 1, for brevity), and the data protection circuit such as the look-ahead type ECC circuit 114E may protect data and/or perform error correction. The transmission interface circuit 118 may conform to a specific communications specification (e.g. UFS specification), and may perform communications according to the specific communications specification, for example, perform communications with the host device 50 for the memory device 100.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the NV memory 120 with the operating commands to perform reading, writing/programing, etc. on memory units (e.g. data pages) having physical addresses within the NV memory 120, where the physical addresses may be associated with the logical addresses. When the memory controller 110 perform an erase operation on any NV memory element 122-*n* of the plurality of NV memory elements 122-1, 122-2, . . . , and 122-N (in which "n" may represent any integer in the interval [1, N]), at least one block of multiple blocks of the NV memory element 122-*n* may be erased, where each block of the blocks may comprise multiple pages (e.g. data pages), and an access operation (e.g. reading or writing) may be performed on one or more pages.

According to some embodiments, the memory device 100 may be implemented to be a memory card conforming to the SD/MMC, CF, MS, XD or UFS specifications, where the memory device 100 may be coupled to the host device 50 through an intermediate device such as a memory card reader, but the present invention is not limited thereto.

Figure 2:
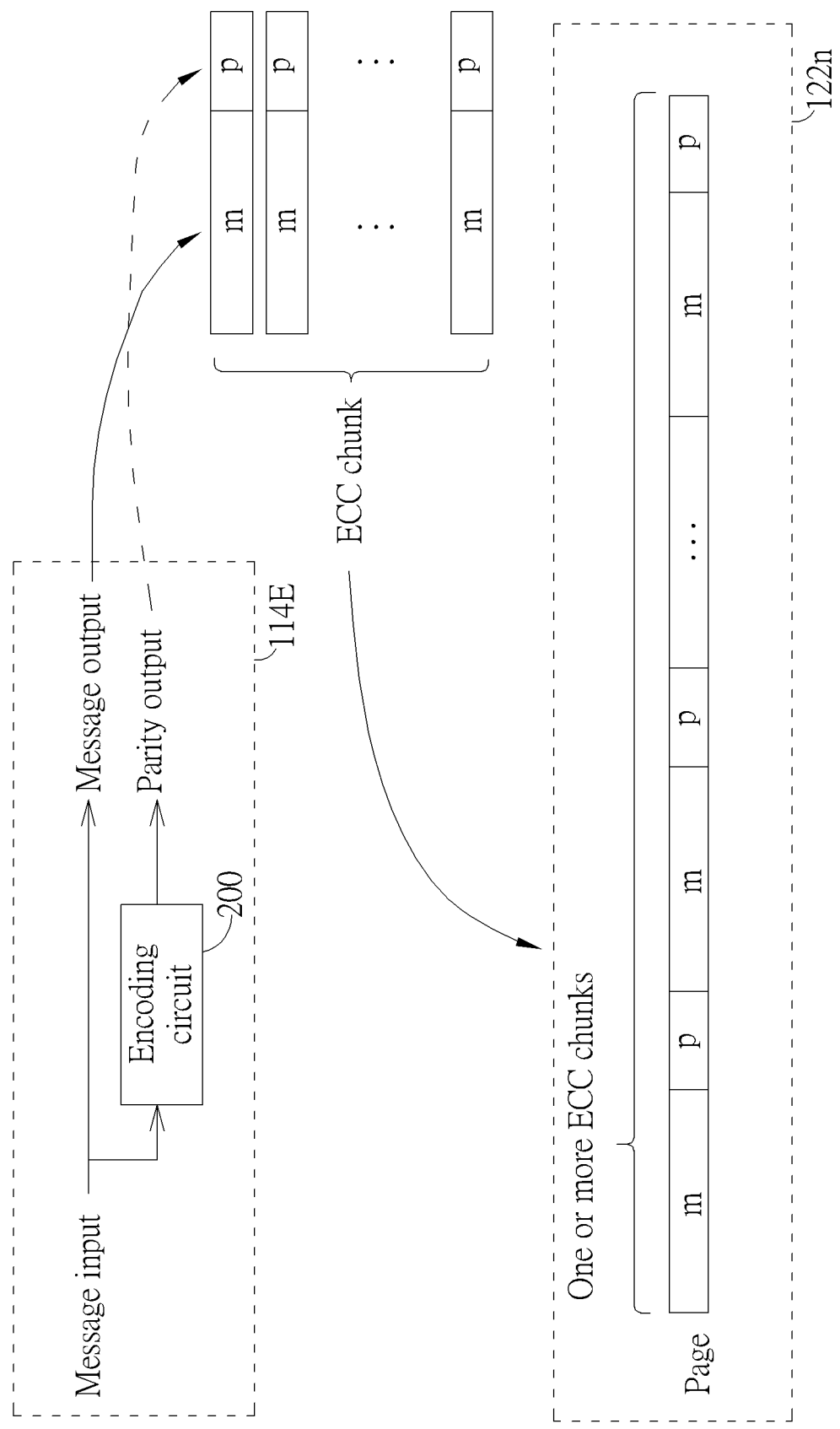
FIG. 2 illustrates some operations regarding error correction code (ECC) processing of the memory device shown in FIG. 1 and some associated components within the memory device according to an embodiment of the present invention.

FIG. 2 illustrates some operations regarding ECC processing of the memory device shown in FIG. 1 and some associated components within the memory device according to an embodiment of the present invention. The look-ahead type ECC circuit 114E may comprise at least one encoding circuit (e.g. one or more encoding circuits) such as the encoding circuit 200 shown in FIG. 2, and the encoding circuit 200 may comprise at least one encoder (e.g. one or more encoders) such as a low-density parity-check (LDPC) encoder, but the present invention is not limited thereto. The look-ahead type ECC circuit 114E may perform ECC processing on a plurality of messages to generate a plurality of parity codes during a write operation or a read operation, where each message of the plurality of messages comprises a set of message bits, and each parity code of the plurality of parity codes comprises a set of parity bits. Taking the write operation as an example, when any message of the plurality of messages is sent into the encoding circuit 200, the message input of the encoding circuit 200 and the message output may represent this message, and the parity output of the encoding circuit 200 may represent the parity code corresponding to this message. The look-ahead type ECC circuit 114E may generate an ECC chunk comprising the plurality of messages and the plurality of parity codes (respectively labeled "m" and "p" in FIG. 2, for brevity) as a protection unit. For example, the ECC chunk may further comprise one or more other parity bits such as one or more rows of parity bits, for protecting the plurality of messages and the plurality of parity codes, where the one or more rows of parity bits may be attached to the rows of messages-parity code combinations within the ECC chunk shown in FIG. 2, but the present invention is not limited thereto. As shown in FIG. 2, the memory controller 110 may write or program one or more ECC chunks into a certain page in a certain block within the NV memory element 112-$n$. As the architecture of the NV memory 120 may vary depending on various design rules of NV memory manufacturers (e.g. Flash memory manufacturers), the number of ECC chunks in each page may vary correspondingly.

Based on the architecture shown in FIG. 1, the memory device 100 may store data for the host device 50, and the memory device 100 may write the data into the NV memory 120 in response to a host command such as a write command from the host device 50. During writing the data into the NV memory 120, the look-ahead type ECC circuit 114E (e.g. the encoding circuit 200) may perform encoding to generate parity bits of a parity code to protect message bits of a message (e.g. any of the plurality of messages), where the message may correspond to a set of data within the data to be written into the NV memory 120. In addition, the memory device 100 may read the stored data in response to another host command such as a read command from the host device 50, and provide the host device 50 with the data read from the NV memory 120. During reading the stored data from the NV memory 120, the look-ahead type ECC circuit 114E (e.g. the encoding circuit 200) may obtain a read out version of the message bits and a read out version of the parity bits. For example, the look-ahead type ECC circuit 114E (e.g. the encoding circuit 200) may perform encoding on the read out version of the message bits to generate a non-read out version of the parity bits, and may determine whether the non-read out version of the parity bits and the read out version of the parity bits are the same to detect whether the read out version of the message bits is correct, but the present invention is not limited thereto. When the non-read out version of the parity bits and the read out version of the parity bits are the same, the look-ahead type ECC circuit 114E (e.g. the encoding circuit 200) may determine that the read out version of the message bits is correct. As a result, the memory controller 110 may utilize the read out version of the message bits as the set of data within the stored data from the NV memory 120, for being transmitted or returned to the host device 50. When there is any difference between the non-read out version of the parity bits and the read out version of the parity bits, the look-ahead type ECC circuit 114E (e.g. the encoding circuit 200) may determine that the read out version of the message bits is incorrect, and perform error correction on the read out version of the message bits according to the read out version of the parity bits to generate a correct version of the message bits. As a result, the memory controller 110 may utilize the correct version of the message bits as the set of data within the stored data from the NV memory 120, for being transmitted or returned to the host device 50. Based on the architecture shown in FIG. 1, and more particularly, the operations regarding ECC processing as shown in FIG. 2, various errors of the data stored in the NV memory 120 can be prevented.

Figure 3:
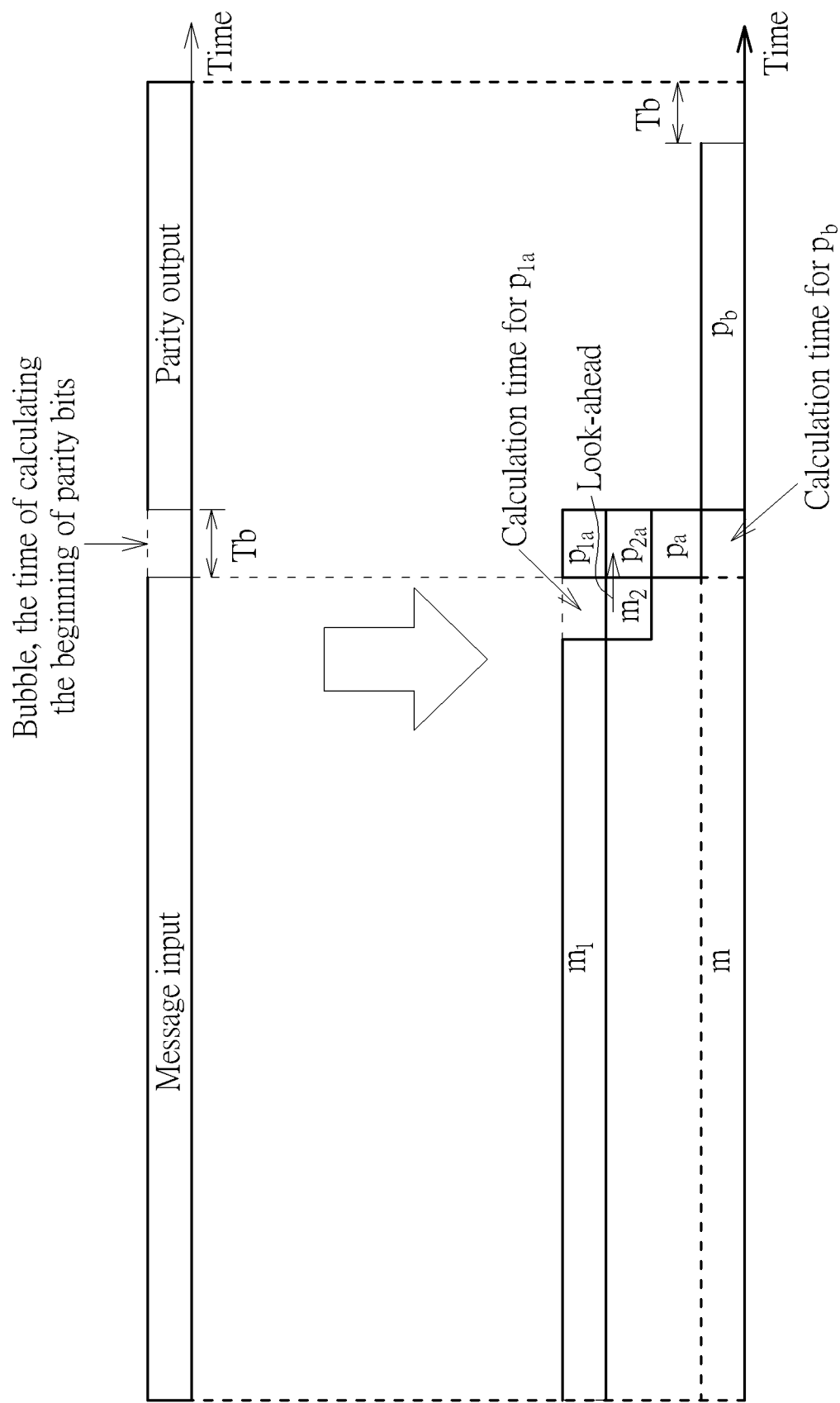
FIG. 3 illustrates an acceleration control scheme of a non-volatile (NV) memory accessing method using data protection with aid of look-ahead processing according to an embodiment of the present invention.

FIG. 3 illustrates an acceleration control scheme of an NV memory accessing method using data protection with aid of look-ahead processing according to an embodiment of the present invention, where the NV memory accessing method is applicable to the architecture shown in FIG. 1, and more particularly, the memory device 100, the memory controller 110, and the look-ahead type ECC circuit 114E (e.g. the encoding circuit 200). For better comprehension, the memory controller 110 may receive a write command such as that mentioned above, and may receive the data corresponding the write command (e.g. the aforementioned data to be written into the NV memory 120) from the host device 50. The encoding circuit 200 may obtain at least one portion of data (e.g. a plurality of sets of data, such as the set of data mentioned above) within the data corresponding the write command to be the plurality of messages {m} of the ECC chunk, to generate the plurality of parity codes {p} of the ECC chunk according to the plurality of messages {m} through look-ahead type encoding of the encoding circuit 200, where the plurality of parity codes {p} correspond to the plurality of messages {m}, respectively, for protecting the plurality of messages {m}, respectively. For example, the respective contents of the plurality of messages {m} may vary depending on the contents of the data received from the host device 50. In addition, the memory controller 110 may write the ECC chunk comprising the plurality of messages {m} and the plurality of parity codes {p} into the NV memory 120. For example, regarding any message m within the plurality of messages {m}, operations of the look-ahead type encoding may comprise: after a first partial message $m_1$ of the message m is sent into the encoding circuit 200, the encoding circuit 200 starts encoding the first partial message $m_1$ to generate a first encoded result $p_{1a}$; after a second partial message $m_2$ of the message m is sent into the encoding circuit 200, the encoding circuit 200 applies predetermined input response information to the second partial message $m_2$ to generate a second encoded result $p_{2a}$, and combines the first encoded result $p_{1a}$ and the second encoded result $p_{2a}$ to generate a first partial parity code $p_a$ of a parity code p corresponding to the message m; and after the message m is fully sent into the encoding circuit 200, the encoding circuit 200 starts encoding the message m (e.g. the message m including the first partial message $m_1$ and the second partial message $m_2$) to generate a second partial parity code $p_b$ of the parity code p corresponding to the message m, and outputs the first partial parity code $p_a$ and the second partial parity code $p_b$ to generate the parity code p corresponding to the message m.

For better comprehension, a typical behavior of a conventional encoding architecture may be illustrated as shown in the upper half of FIG. 3, where there is a "bubble" such as the time of calculating the beginning of parity bits. For example, the length of time of the bubble may be equal to Tb. As shown in the lower half of FIG. 3, the encoding circuit 200 may start calculating the first encoded result $p_{1a}$ after completely receiving the first partial message $m_1$ to prepare the first encoded result $p_{1a}$ in advance, and may utilize the time period between the time point of completely receiving the first partial message $m_1$ and the time point of completely receiving the message m as the calculation time for the first encoded result $p_{1a}$. In addition, the encoding circuit 200 may immediately generate the second encoded result $p_{2a}$ with aid of the look-ahead processing after completely receiving the second partial message $m_2$ to prepare the first partial parity code $p_a$ within a predetermined time. For example, the time of preparing any bit (e.g. the first bit) of the first partial parity code $p_a$ may be as short as a clock cycle, which is much shorter than the bubble mentioned above. More particularly, at the moment that is just after completely receiving the message m (e.g. the next clock cycle of a certain clock cycle in which the last bit of the message m is received), the first bit of the first partial parity code $p_a$ is ready for being outputted from the encoding circuit 200. As the first bit of the first partial parity code $p_a$ indeed exists at this moment, the encoding circuit 200 may start outputting the beginning of the parity code p, such as the first partial parity code $p_a$, having no need to wait. Additionally, the encoding circuit 200 may utilize the time period between the time point of completely receiving the message m and the time point of completely outputting the first partial parity code $p_a$ as the calculation time for the second partial parity code $p_b$, and may start outputting the second partial parity code $p_b$ in time. As a result, the encoding circuit 200 can output the parity code p comprising the first partial parity code $p_a$ and the second partial parity code $p_b$ without generating any bubble. Therefore, the encoding circuit 200 can accelerate the whole processing to make the completion time earlier, for example, with a decrement of time such as Tb, but the present invention is not limited thereto. In comparison with the related art, the memory device 100 utilizing the acceleration control scheme of the NV memory accessing method can achieve better performance.

Figure 4:
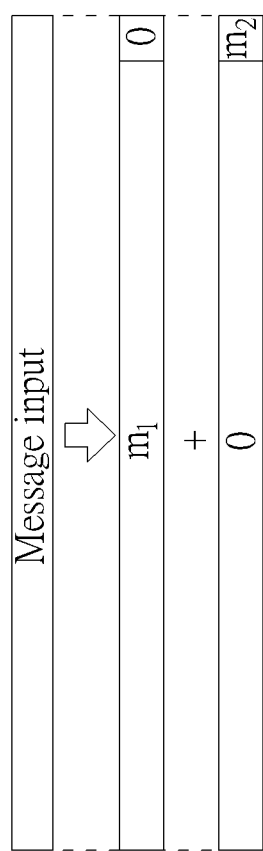
FIG. 4 illustrates a message partition control scheme of the NV memory accessing method shown in FIG. 3 according to an embodiment of the present invention.

FIG. 4 illustrates a message partition control scheme of the NV memory accessing method shown in FIG. 3 according to an embodiment of the present invention. The message m may comprise a set of message bits, and may be divided into the first partial message $m_1$ and the second partial message $m_2$ as shown in FIG. 4. The first partial message $m_1$ may comprise a plurality of beginning bits within the set of message bits, and the second partial message $m_2$ may comprise a plurality of remaining bits $\{m_{2,j}, j=0, 1, \ldots, k-1\}$ (e.g. $m_{2,j}=0$ or 1) within the set of message bits, where the symbol "k" may represent a positive integer. For example, the message m is equivalent to a result of adding a first sequence comprising the first partial message $m_1$ and zero bits at the end portion of the first sequence (labeled "0" next to the first partial message $m_1$ in FIG. 4, for better comprehension) and a second sequence comprising the second partial message $m_2$ and zero bits (labeled "0" next to the second partial message $m_2$ in FIG. 4, for better comprehension) at the beginning portion of the second partial message $m_2$.

Figure 5:
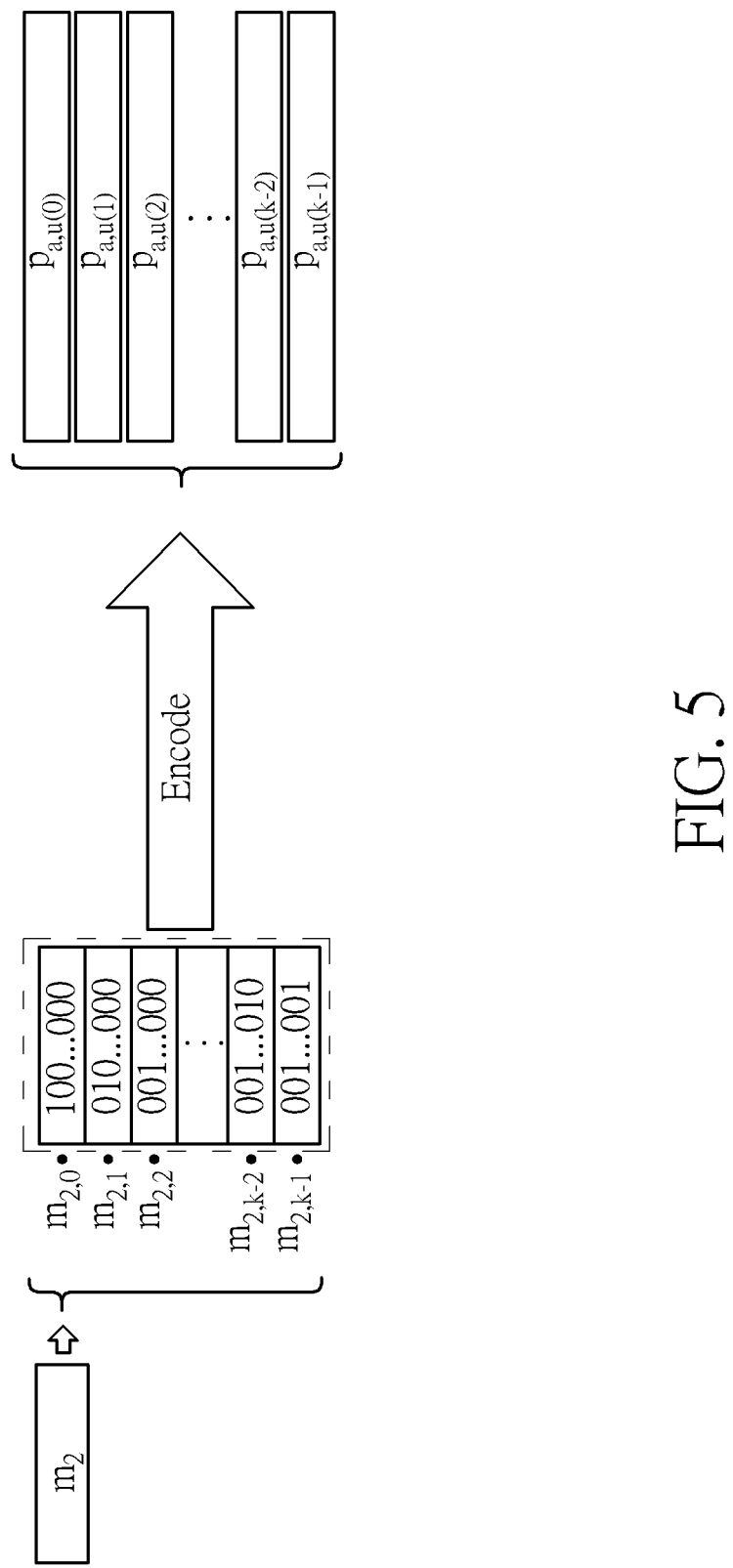
FIG. 5 illustrates an impulse response mapping control scheme of the NV memory accessing method shown in FIG. 3 according to an embodiment of the present invention.

FIG. 5 illustrates an impulse response mapping control scheme of the NV memory accessing method shown in FIG. 3 according to an embodiment of the present invention. As shown in the left half of FIG. 5, the second partial message $m_2$ may be regarded as a linear combination $((m_{2,0} \cdot u_0) + (m_{2,1} \cdot u_1) + (m_{2,2} \cdot u_2) + \ldots + (m_{2,k-2} \cdot u_{k-2}) + (m_{2,k-1} \cdot u_{k-1}))$ of a plurality of bases $\{u_0, u_1, u_2, \ldots, u_{k-2}, u_{k-1}\}$ (e.g. the k rows of bits $\{100 \ldots 000, 010 \ldots 000, 001 \ldots 000, \ldots, 000 \ldots 010, 000 \ldots 001\}$ shown in FIG. 5, with each row thereof having k bits), where the plurality of remaining bits $\{m_{2,j}, j=0, 1, \ldots, k-1\}$ such as $m_{2,0}, m_{2,1}, m_{2,2}, \ldots, m_{2,k-2},$ and $m_{2,k-1}$ may be regarded as the respective coefficients of the plurality of bases $\{u_0, u_1, u_2, \ldots, u_{k-2}, u_{k-1}\}$ within the linear combination $((m_{2,0} \cdot u_0) + (m_{2,1} \cdot u_1) + (m_{2,2} \cdot u_2) + \ldots + (m_{2,k-2} \cdot u_{k-2}) + (m_{2,k-1} \cdot u_{k-1}))$, but the present invention is not limited thereto. In addition, each basis of the plurality of bases $\{u_0, u_1, u_2, \ldots, u_{k-2}, u_{k-1}\}$ may comprise a plurality of basis bits such as k bits, and the bit count k of the plurality of remaining bits $\{m_{2,j}, j=0, 1, \ldots, k-1\}$ (e. g. $m_{2,0}, m_{2,1}, m_{2,2}, \ldots, m_{2,k-2},$ and $m_{2,k-1}$) within the set of message bits of the message m and the bit count k of the plurality of basis bits are equal to each other. For better comprehension, assume that the plurality of bases $\{u_0, u_1, u_2, \ldots, u_{k-2}, u_{k-1}\}$ may be arranged in a row by row manner, and more particularly, arranged to be the k rows of bits $\{100 \ldots 000, 010 \ldots 000, 001 \ldots 000, \ldots, 000 \ldots 010, 000 \ldots 001\}$.

In this situation, the arrangement result of all bits of the k rows of bits $\{100 \ldots 000, 010 \ldots 000, 001 \ldots 000, \ldots, 000 \ldots 010, 000 \ldots 001\}$ may be regarded as an identity matrix $I_k$ having (k*k) elements.

According to this embodiment, the predetermined input response information may comprise a plurality of basis parity codes $\{p_{a,u(0)}, p_{a,u(1)}, p_{a,u(2)}, \ldots, p_{a,u(k-2)}, p_{a,u(k-1)}\}$ respectively corresponding to the plurality of bases $\{u_0, u_1, u_2, \ldots, u_{k-2}, u_{k-1}\}$ (e.g. the k rows of bits $\{100 \ldots 000, 010 \ldots 000, 001 \ldots 000, \ldots, 000 \ldots 010, 000 \ldots 001\}$). As shown in the right half of FIG. 5, the plurality of basis parity codes $\{p_{a,u(0)}, p_{a,u(1)}, p_{a,u(2)}, \ldots, p_{a,u(k-2)}, p_{a,u(k-1)}\}$ may be generated by encoding the plurality of bases $\{u_0, u_1, u_2, \ldots, u_{k-2}, u_{k-1}\}$ (e.g. the k rows of bits $\{100 \ldots 000, 010 \ldots 000, 001 \ldots 000, \ldots, 000 \ldots 010, 000 \ldots 001\}$) in the same way as that for encoding the first partial message $m_1$, respectively. For example, the same LDPC encoding method may be utilized for both of the following operations: encoding the first partial message $m_1$ to generate the first encoded result $p_{1a}$; and encoding the plurality of bases $\{u_0, u_1, u_2, \ldots, u_{k-2}, u_{k-1}\}$ (e.g. the k rows of bits $\{100 \ldots 000, 010 \ldots 000, 001 \ldots 000, \ldots, 000 \ldots 010, 000 \ldots 001\}$) to generate the plurality of basis parity codes $\{p_{a,u(0)}, p_{a,u(1)}, p_{a,u(2)}, \ldots, p_{a,u(k-2)}, p_{a,u(k-1)}\}$, respectively. In addition, a production tool such as another host device (e.g. a personal computer such as a desktop computer and a laptop computer) may be arranged to perform the operations of encoding the plurality of bases $\{u_0, u_1, u_2, \ldots, u_{k-2}, u_{k-1}\}$ to generate the plurality of basis parity codes $\{p_{a,u(0)}, p_{a,u(1)}, p_{a,u(2)}, \ldots, p_{a,u(k-2)}, p_{a,u(k-1)}\}$, respectively, for being stored into the memory device 100 in advance. For example, in a production phase, under control of the production tool, the memory controller 110 may store the plurality of basis parity codes $\{p_{a,u(0)}, p_{a,u(1)}, p_{a,u(2)}, \ldots, p_{a,u(k-2)}, p_{a,u(k-1)}\}$ in a system information region within the NV memory 120, for being loaded into the encoding circuit 200 during boot up of the memory device 100 for use of a user, but the present invention is not limited thereto. As the predetermined input response information such as the plurality of basis parity codes $\{p_{a,u(0)}, p_{a,u(1)}, p_{a,u(2)}, \ldots, p_{a,u(k-2)}, p_{a,u(k-1)}\}$ is prepared in advance and is available for the encoding circuit 200, the encoding circuit 200 may perform the look-ahead processing according to the predetermined input response information when needed.

According to some embodiments, implementation of preparing the plurality of basis parity codes $\{p_{a,u(0)}, p_{a,u(1)}, p_{a,u(2)}, \ldots, p_{a,u(k-2)}, p_{a,u(k-1)}\}$ may vary. For example, in the production phase, under control of the production tool, the memory controller 110 may store the plurality of basis parity codes $\{p_{a,u(0)}, p_{a,u(1)}, p_{a,u(2)}, \ldots, p_{a,u(k-2)}, p_{a,u(k-1)}\}$ in a certain storage unit in the memory controller 110, for being loaded into the encoding circuit 200 during boot up of the memory device 100 for use of the user. For another example, according to default settings or user settings, the memory controller 110 may control the encoding circuit 200 (e.g. the LDPC encoder therein) to encode the plurality of bases $\{u_0, u_1, u_2, \ldots, u_{k-2}, u_{k-1}\}$ (e.g. the k rows of bits $\{100 \ldots 000, 010 \ldots 000, 001 \ldots 000, \ldots, 000 \ldots 010, 000 \ldots 001\}$) to generate the plurality of basis parity codes $\{p_{a,u(0)}, p_{a,u(1)}, p_{a,u(2)}, \ldots, p_{a,u(k-2)}, p_{a,u(k-1)}\}$, respectively. For yet another example, the plurality of basis parity codes $\{p_{a,u(0)}, p_{a,u(1)}, p_{a,u(2)}, \ldots, p_{a,u(k-2)}, p_{a,u(k-1)}\}$ may be implemented as a portion of hardware circuits within the encoding circuit 200.

Figure 6:
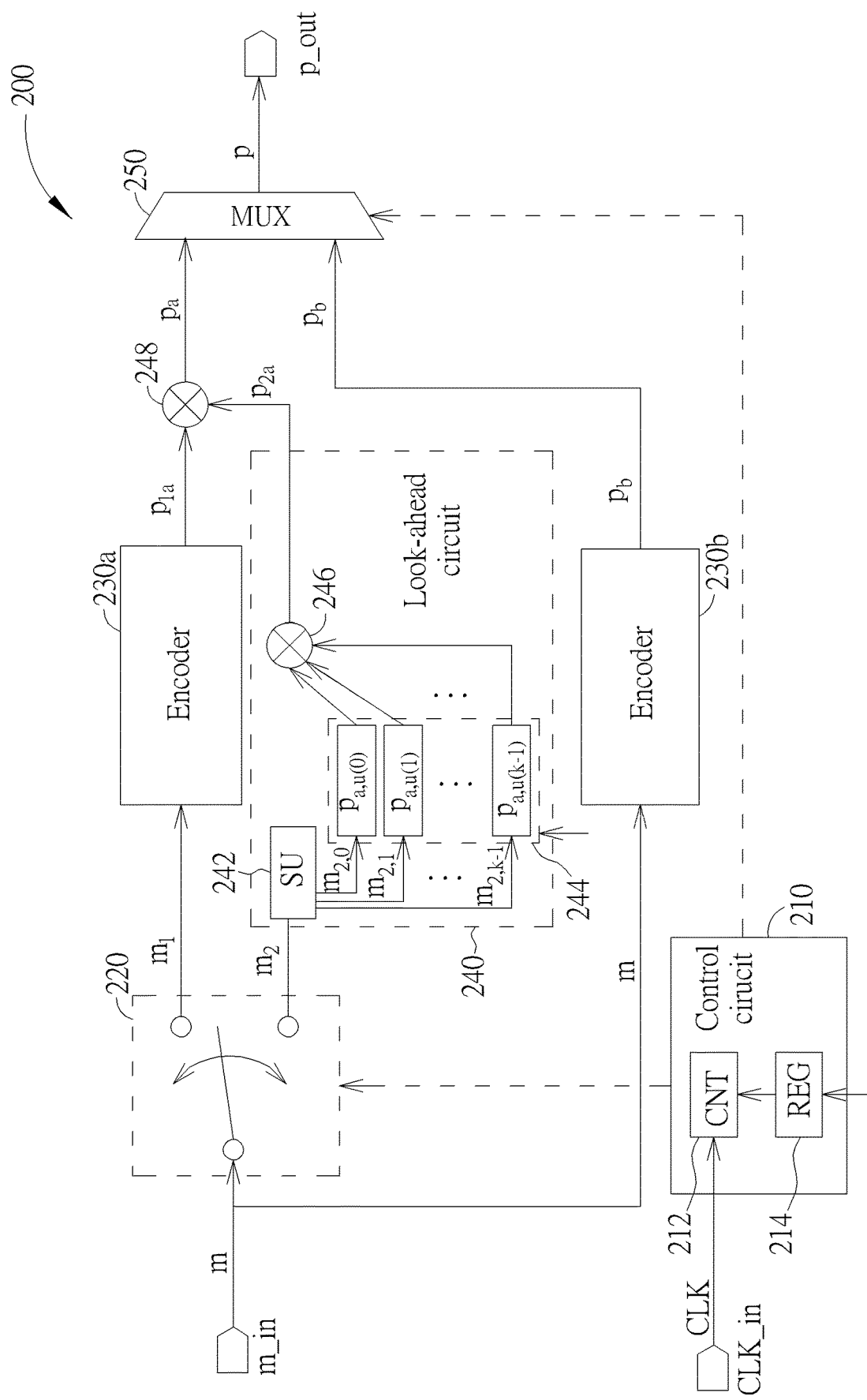
FIG. 6 is a diagram of an encoding circuit corresponding to the NV memory accessing method shown in FIG. 3 according to an embodiment of the present invention.

FIG. 6 is a diagram of the encoding circuit 200 corresponding to the NV memory accessing method shown in FIG. 3 according to an embodiment of the present invention. The encoding circuit 200 may be arranged to perform encoding with aid of the look-ahead processing for data protection during accessing the NV memory 120. As shown in FIG. 6, the encoding circuit 200 may comprise input terminals such as a message input terminal m_in and a clock input terminal CLK_in, an output terminal such as a parity output terminal p_out, a control circuit 210, a switching circuit 220 that is coupled to the message input terminal m_in and the control circuit 210, encoders 230a and 230b that are respectively coupled to the switching circuit 220 and the message input terminal m_in, a look-ahead circuit 240 that is coupled to the switching circuit 220, a combining circuit 248 that is coupled to the encoder 230a and the look-ahead circuit 240, and an output circuit 250 that is coupled to the combining circuit 248 and the encoder 230b. In addition, the control circuit 210 may comprise a counter 212 and a register circuit 214 (respectively labeled "CNT" and "REG" in FIG. 6 for brevity), and the look-ahead circuit 240 may comprise a storage unit 242 (labeled "SU" in FIG. 6 for brevity), a multiplication circuit 244 comprising a plurality of sub-circuits respectively corresponding to the plurality of basis parity codes $\{p_{a,u(0)}, p_{a,u(1)}, \ldots, p_{a,u(k-1)}\}$ (labeled "$p_{a,u(0)}$", "$p_{a,u(1)}$", ... and "$p_{a,u(k-1)}$" in FIG. 6, for better comprehension), and an addition circuit 246. For example, the combining circuit 248 and the output circuit 250 may be respectively implemented with an exclusive-OR (XOR) gate and a multiplexer (respectively labeled "X" and "MUX" in FIG. 6, for better comprehension), the plurality of sub-circuits of the multiplication circuit 244 may comprise a plurality of registers for storing the plurality of basis parity codes $\{p_{a,u(0)}, p_{a,u(1)}, \ldots, p_{a,u(k-1)}\}$ and comprise a plurality of AND gates for performing binary multiplication, and the addition circuit 246 may comprise a plurality of XOR gates (labeled "X" in FIG. 6 for better comprehension) for performing binary addition, but the present invention is not limited thereto.

According to this embodiment, the control circuit 210 may be arranged to control the encoding circuit 200 to perform encoding with aid of the look-ahead processing for data protection during accessing the NV memory 120. The message input terminal m_in is arranged to receive the message m within the plurality of messages $\{m\}$, and the switching circuit 220 is arranged to perform switching under control of the control circuit 210, to divide the message m into the first partial message $m_1$ and the second partial message $m_2$. For example, when the encoding circuit 200 starts receiving the message m according to the clock signal CLK received through the clock input terminal CLK_in, the control circuit 210 may enable a first partial message path (e.g. the upper output path of the switching circuit 220) and disable a second partial message path (e.g. the lower output path of the switching circuit 220), and the counter 212 may start counting the number of bits that have been received as the first partial message $m_1$ to generate a first counter value, in order to determine whether the operation of receiving the first partial message $m_1$ has been completed according to a first predetermined value (e.g. a predetermined number of bits of the first partial message $m_1$, such as k0), where the first counter value reaching the first predetermined value may indicate that the operation of receiving the first partial message $m_1$ has been completed. After the first partial message $m_1$ completely sent into the encoding circuit 200, and more particularly, the encoder 230a, the encoder 230a starts encoding the first partial message $m_1$ to generate the first encoded result $p_{1a}$.

When the encoding circuit 200 starts receiving the second partial message $m_2$, the control circuit 210 may disable the first partial message path (e.g. the upper output path of the switching circuit 220) and enable the second partial message path (e.g. the lower output path of the switching circuit 220), and the counter 212 may start counting the number of bits that have been received as the second partial message $m_2$ to generate a second counter value, in order to determine whether the operation of receiving the second partial message $m_2$ has been completed according to a second predetermined value (e.g. a predetermined number of bits of the second partial message m, such as k), where the second counter value reaching the second predetermined value may indicate that the operation of receiving the second partial message $m_2$ has been completed. The first predetermined value and the second predetermined value may be stored in the register circuit 214, for example, may be loaded into the register circuit 214 during boot up of the memory device 100, but the present invention is not limited thereto. In addition, the storage unit 242 may comprise a plurality of registers for storing the bits $m_{2,0}, m_{2,1}, \ldots$, and $m_{2,k-1}$ of the second partial message $m_2$. After the second partial message $m_2$ is completely sent into the encoding circuit 200, and more particularly, the storage unit 242 of the look-ahead circuit 240, each bit of the second partial message $m_2$ is available for the look-ahead processing, and the look-ahead circuit 240 and the combining circuit 248 may operate at the same time to generate the first partial parity code $p_a$. For example, the look-ahead circuit 240 applies the predetermined input response information such as the plurality of basis parity codes $\{p_{a,u(0)}, p_{a,u(1)}, \ldots, p_{a,u(k-1)}\}$ to the second partial message $m_2$ to generate the second encoded result $p_{2a}$, and the combining circuit 248 combines the first encoded result $p_{1a}$ and the second encoded result $p_{2a}$ to generate the first partial parity code $p_a$.

Regarding these operations of the look-ahead circuit 240, the multiplication circuit 244 may multiply the plurality of basis parity codes $\{p_{a,u(0)}, p_{a,u(1)}, \ldots, p_{a,u(k-1)}\}$ by the bits $m_{2,0}$, $m_{2,1}$, ..., and $m_{2,k-1}$ of the second partial message $m_2$ to generate a plurality of multiplying results such as a plurality of products $\{(m_{2,0} \cdot p_{a,u(0)}), (m_{2,1} \cdot p_{a,u(1)}), \ldots, (m_{2,k-1} \cdot p_{a,u(k-1)})\}$, respectively, and the addition circuit 246 may combine the plurality of multiplying results such as the plurality of products $\{(m_{2,0} \cdot p_{a,u(0)}), (m_{2,1} \cdot p_{a,u(1)}), \ldots, (m_{2,k-1} \cdot p_{a,u(k-1)})\}$ to generate the second encoded result $p_{2a}$. Please note that the parity code p may comprise a set of parity bits, where the first partial parity code $p_a$ may comprise a plurality of beginning bits within the set of parity bits, and the second partial parity code $p_b$ may comprise a plurality of remaining bits within the set of parity bits. According to this embodiment, each basis parity code of the plurality of basis parity codes $\{p_{a,u(0)}, p_{a,u(1)}, \ldots, p_{a,u(k-1)}\}$ may comprise a plurality of basis parity bits, and the bit count of the plurality of beginning bits within the set of parity bits (e.g. the length of the first partial parity code $p_a$) and the bit count of the plurality of basis parity bits (e.g. the length of each of the plurality of basis parity codes $\{p_{a,u(0)}, p_{a,u(1)}, \ldots, p_{a,u(k-1)}\}$) are equal to each other. In addition, both of the bit count of the first encoded result $p_{1a}$ and the bit count of the second encoded result $p_{2a}$ are equal to the bit count of the plurality of beginning bits within the set of parity bits (e.g. the length of the first partial parity code $p_a$). Regarding the operations of combining the first encoded result $p_{1a}$ and the second encoded result $p_{2a}$, the combining circuit 248 may add the respective bits of the first encoded result $p_{1a}$ and the second encoded result $p_{2a}$ in a bit by bit manner to generate the first partial parity code $p_a$. For example, these operations of the combining circuit 248 may comprise: adding the first bit of the first encoded result $p_{1a}$ and the first bit of the second encoded result $p_{2a}$ to generate the first bit of the first partial parity code $p_a$; adding the second bit of the first encoded result $p_{1a}$ and the second bit of the second encoded result $p_{2a}$ to generate the second bit of the first partial parity code $p_a$; and so on. After adding the last bit of the first encoded result $p_{1a}$ and the last bit of the second encoded result $p_{2a}$ to generate the last bit of the first partial parity code $p_a$, the combining circuit 248 may completely output the first partial parity code $p_a$.

Additionally, the encoder 230b may utilize the time period between the time point of completely receiving the message m and the time point of completely outputting the first partial parity code $p_a$ as the calculation time for the second partial parity code $p_b$. After the message m is fully sent into the encoding circuit 200 (more particularly, the encoder 230b), the encoder 230b starts encoding the message m (e.g. the message m including the first partial message $m_1$ and the second partial message $m_2$) to generate the second partial parity code $p_b$. Under control of the control circuit 210, the output circuit 250 outputs the first partial parity code $p_a$ and the second partial parity code $p_b$ to generate the parity code p, for being outputted through the parity output terminal p_out. The operations of partial parity path selection regarding the first partial parity code $p_a$ and the second partial parity code $p_b$ may correspond to the time of generating the first partial parity code $p_a$ and the second partial parity code $p_b$, respectively. As the encoding circuit 200 (e.g. the encoder 230a, the look-ahead circuit 240, and the combining circuit 248 therein) is capable of generating the first bit of the first partial parity code $p_a$ at the moment that is just after completely receiving the message m (e.g. the next clock cycle of the clock cycle in which the last bit of the message m is received), the time difference between this moment and the time of the encoding circuit 200 completely outputting the first partial parity code $p_a$ (e.g. a number of clock cycles for outputting the first partial parity code $p_a$) may correspond to the bit count of the first partial parity code $p_a$ (e.g. the length of the first partial parity code $p_a$). For example, when the output circuit 250 starts receiving the parity code p including the first partial parity code $p_a$, the control circuit 210 may enable a first partial parity path (e.g. the upper input path of output circuit 250) and disable a second partial parity path (e.g. the lower input path of the output circuit 250), to make the output circuit 250 output the first partial parity code $p_a$ through the parity output terminal pout. At the end of the time difference, the output circuit 250 has completed the operations of receiving and outputting the first partial parity code $p_a$, and the first bit of the second partial parity code $p_b$ is available. When the output circuit 250 starts receiving the second partial parity code p, the control circuit 210 may disable the first partial parity path (e.g. the upper input path of output circuit 250) and enable the second partial parity path (e. g. the lower input path of the output circuit 250), to make the output circuit 250 output the second partial parity code p through the parity output terminal p_out. The operations of controlling the time of outputting the first partial parity code $p_a$ and the time of outputting the second partial parity code $p_b$ may be implemented with counting operations similar to that of the counter 212. For example, the control circuit 210 may comprise another counter that is coupled to the register circuit 214, and utilize the other counter to control the partial parity path selection of the output circuit 250.

Based on the NV memory accessing method and the associated architecture such as the encoding circuit 200 shown in FIG. 6, the memory device 100 (e.g. the memory controller 110 and the look-ahead type ECC circuit 114E thereof) can continuously process the plurality of messages {m} of the ECC chunk without generating any bubble. For brevity, similar descriptions for this embodiment are not repeated in detail here.

Figure 7:
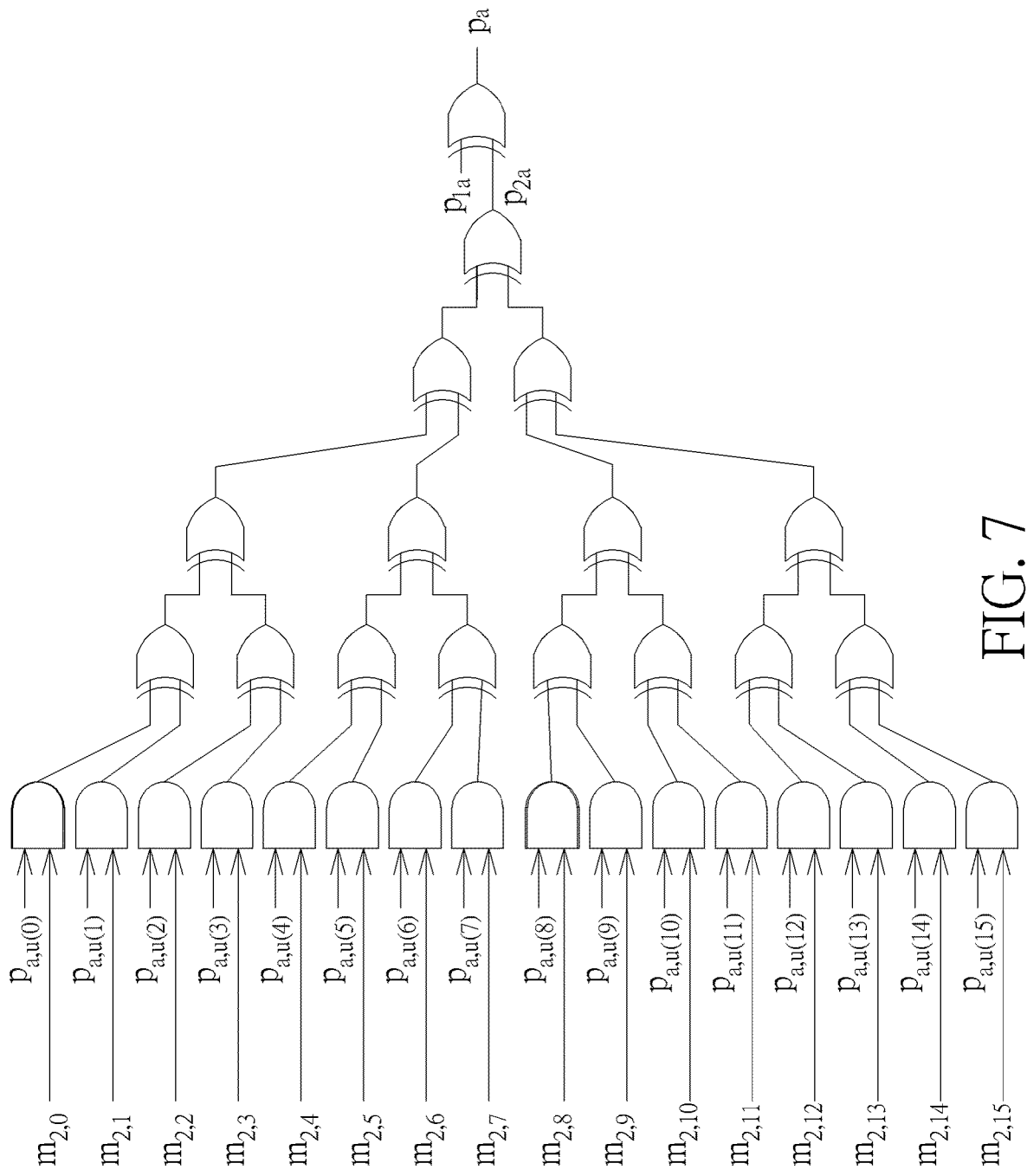
FIG. 7 illustrates some implementation details of the encoding circuit shown in FIG. 6 according to an embodiment of the present invention.

FIG. 7 illustrates some implementation details of the encoding circuit 200 shown in FIG. 6 according to an embodiment of the present invention. For better comprehension, assume that the plurality of basis parity codes $\{p_{a,u(0)}, p_{a,u(1)}, \ldots, p_{a,u(k-1)}\}$ comprises 16 basis parity codes $\{p_{a,u(0)}, p_{a,u(1)}, p_{a,u(2)}, p_{a,u(3)}, p_{a,u(4)}, p_{a,u(5)}, p_{a,u(6)}, p_{a,u(7)}, p_{a,u(8)}, p_{a,u(9)}, p_{a,u(10)}, p_{a,u(11)}, p_{a,u(12)}, p_{a,u(13)}, p_{a,u(14)}, p_{a,u(15)}\}$, and the bits $m_{2,0}, m_{2,1}, \ldots,$ and $m_{2,k-1}$ of the second partial message $m_2$ comprises 16 bits $\{m_{2,0}, m_{2,1}, m_{2,2}, m_{2,3}, m_{2,4}, m_{2,5}, m_{2,6}, m_{2,7}, m_{2,8}, m_{2,9}, m_{2,10}, m_{2,11}, m_{2,12}, m_{2,13}, m_{2,14}, m_{2,15}\}$, where k=16 in this embodiment, but the present invention is not limited thereto. The AND gates shown in FIG. 7 may be taken as examples of the plurality of AND gates for performing the binary multiplication, the first four layers of XOR gates shown in FIG. 7 that generate the second encoded result $p_{2a}$ (i.e. the XOR gates except the rightmost XOR gate) may be taken as examples of the plurality of XOR gates for performing the binary addition, and the rightmost XOR gate shown in FIG. 7 may be taken as an example of the XOR gate of the combining circuit 248. For brevity, similar descriptions for this embodiment are not repeated in detail here.

According to some embodiments, in the operations of multiplying the plurality of basis parity codes $\{p_{a,u(0)}, p_{a,u(1)}, \ldots p_{a,u(k-1)}\}$ by the bits $m_{2,0}, m_{2,1}, \ldots,$ and $m_{2,k-1}$ of the second partial message $m_2$ to generate the plurality of multiplying results such as the plurality of products $\{(m_{2,0} \cdot p_{a,u(0)}), (m_{2,1} \cdot p_{a,u(1)}), \ldots, (m_{2,k-1} \cdot p_{a,u(k-1)})\}$, the plurality of AND gates (e.g. the AND gates shown in FIG. 7) may perform a plurality of AND operations on the plurality of basis parity codes $\{p_{a,u(0)}, p_{a,u(1)}, \ldots, p_{a,u(k-1)}\}$ and the bits $m_{2,0}, m_{2,1}, \ldots,$ and $m_{2,k-1}$ of the second partial message $m_2$ to generate the plurality of multiplying results such as the plurality of products $\{(m_{2,0} \cdot p_{a,u(0)}), (m_{2,1} \cdot p_{a,u(1)}), \ldots, (m_{2,k-1} \cdot p_{a,u(k-1)})\}$, respectively. Additionally, in the operations of combining the plurality of multiplying results such as the plurality of products $\{(m_{2,0} \cdot p_{a,u(0)}), (m_{2,1} \cdot p_{a,u(1)}), \ldots, (m_{2,k-1} \cdot p_{a,u(k-1)})\}$ to generate the second encoded result $p_{2a}$, the plurality of XOR gates (e.g. the first four layers of XOR gates shown in FIG. 7 that generate the second encoded result $p_{2a}$) may perform a plurality of XOR operations on the plurality of multiplying results such as the plurality of products $\{(m_{2,0} \cdot p_{a,u(0)}), (m_{2,1} \cdot p_{a,u(1)}), \ldots, (m_{2,k-1} \cdot p_{a,u(k-1)})\}$ to generate the second encoded result $p_{2a}$. Through the plurality of AND operations and the plurality of XOR operations, applying the predetermined input response information to the second partial message $m_2$ to generate the second encoded result $p_{2a}$ can be completed within a predetermined time after the second partial message $m_2$ is sent into the encoding circuit 200. For example, through the plurality of AND operations and the plurality of XOR operations, the time of preparing any bit of the second encoded result $p_{2a}$ is within one clock cycle. More particularly, through at least one portion of the plurality of AND operations and the plurality of XOR operations, the time of preparing the first bit of the second encoded result $p_{2a}$ is within one clock cycle after the second partial message $m_2$ is sent into the encoding circuit 200. For brevity, similar descriptions for these embodiments are not repeated in detail here.

According to some embodiments, in the operations of combining the first encoded result $p_{1a}$ and the second encoded result $p_{2a}$ to generate the first partial parity code $p_a$ of the parity code p corresponding to the message m, the XOR gate of the combining circuit 248 (e.g. the rightmost XOR gate shown in FIG. 7) may perform an XOR operation on the first encoded result $p_{1a}$ and the second encoded result $p_{2a}$ to generate the first partial parity code $p_a$ of the parity code p. Through the plurality of AND operations, the plurality of XOR operations and the XOR operation, applying the predetermined input response information to the second partial message $m_2$ to generate the second encoded result $p_{2a}$ and combining the first encoded result $p_{1a}$ and the second encoded result $p_{2a}$ to generate the first partial parity code $p_a$ of the parity code p corresponding to the message m are completed within the predetermined time after the second partial message $m_2$ is sent into the encoding circuit 200. For example, through the plurality of AND operations, the plurality of XOR operations and the XOR operation, the time of preparing any bit of the first partial parity code $p_a$ is within one clock cycle. More particularly, through at least one portion of the plurality of AND operations, the plurality of XOR operations and the XOR operation, the time of preparing the first bit of the first partial parity code $p_a$ is within one clock cycle after the second partial message $m_2$ is sent into the encoding circuit 200. For brevity, similar descriptions for these embodiments are not repeated in detail here.

Figure 8:
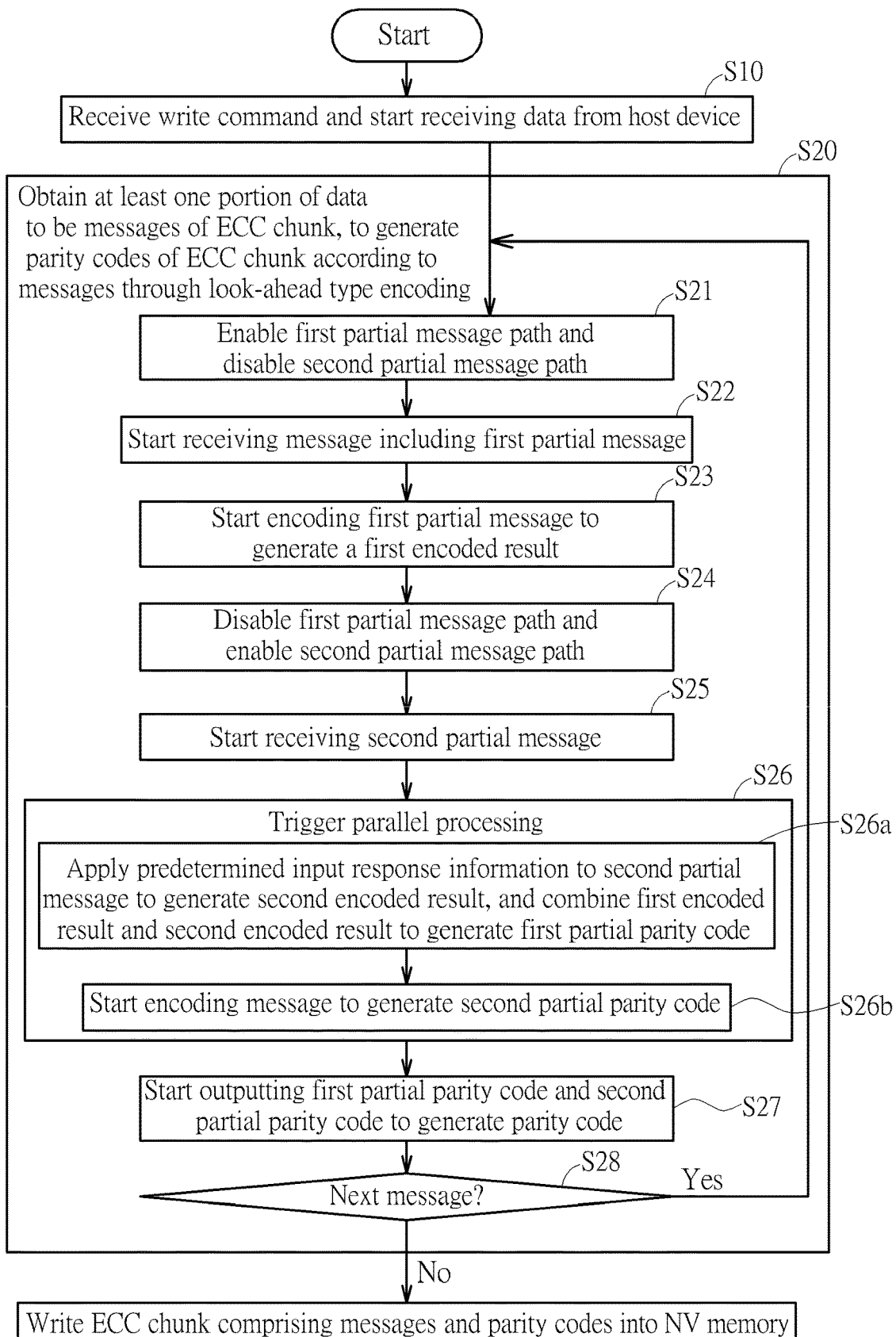
FIG. 8 illustrates a working flow of the NV memory accessing method shown in FIG. 3 according to an embodiment of the present invention.

FIG. 8 illustrates a working flow of the NV memory accessing method shown in FIG. 3 according to an embodiment of the present invention, where the NV memory accessing method is applicable to the memory device 100 and the memory controller 110.

In Step S10, the memory controller 110 may receive the write command and start receiving the data corresponding the write command (e.g. the aforementioned data to be written into the NV memory 120) from the host device 50.

In Step S20, the encoding circuit 200 may obtain the aforementioned at least one portion of data (e.g. the plurality of sets of data, such as the set of data mentioned above) to be the plurality of messages $\{m\}$ of the ECC chunk, to generate the plurality of parity codes $\{p\}$ of the ECC chunk according to the plurality of messages $\{m\}$ through the look-ahead type encoding of the encoding circuit 200.

In Step S21, when the encoding circuit 200 starts receiving the message m, the control circuit 210 may enable the first partial message path (e.g. the upper output path of the switching circuit 220) and disable the second partial message path (e.g. the lower output path of the switching circuit 220).

In Step S22, the encoding circuit 200 may start receiving the message m including the first partial message $m_1$. For example, under control of the control circuit 210, the encoder 230a may start receiving the first partial message $m_1$. For another example, the encoder 230b may start receiving the message m including the first partial message $m_1$.

In Step S23, after the first partial message $m_1$ completely sent into the encoding circuit 200 (more particularly, the encoder 230a), the encoder 230a may start encoding the first partial message $m_1$ to generate the first encoded result $p_{1a}$.

In Step S24, when the encoding circuit 200 starts receiving the second partial message $m_2$, the control circuit 210 may disable the first partial message path (e.g. the upper output path of the switching circuit 220) and enable the second partial message path (e.g. the lower output path of the switching circuit 220).

In Step S25, the encoding circuit 200 may start receiving the second partial message $m_2$. For example, under control of the control circuit 210, the look-ahead circuit 240 may start receiving the second partial message $m_2$. For another example, the encoder 230b may start receiving the second partial message $m_2$.

In Step S26, the encoding circuit 200 may trigger parallel processing.

In Step S26a, after the second partial message $m_2$ is completely sent into the encoding circuit 200 (more particularly, the storage unit 242 of the look-ahead circuit 240), the look-ahead circuit 240 may apply the predetermined input response information such as the plurality of basis parity codes $\{p_{a,u(0)}, p_{a,u(1)}, \ldots, p_{a,u(k-1)}\}$ to the second partial message $m_2$ to generate the second encoded result $p_{2a}$, and the combining circuit 248 may combine the first encoded result $p_{1a}$ and the second encoded result $p_{2a}$ to generate the first partial parity code $p_a$.

In Step S26b, after the message m is fully sent into the encoding circuit 200 (more particularly, the encoder 230b), the encoder 230b may start encoding the message m (e.g. the message m including the first partial message $m_1$ and the second partial message $m_2$) to generate the second partial parity code $p_b$.

In Step S27, at the moment that is just after completely receiving the message m (e.g. the next clock cycle of the clock cycle in which the last bit of the message m is received), the encoding circuit 200 (e.g. the encoder 230a, the look-ahead circuit 240, and the combining circuit 248 therein) may start outputting the first partial parity code $p_a$ and the second partial parity code $p_b$ to generate the parity code p.

In Step S28, the encoding circuit 200 (e.g. the control circuit 210) may check whether processing a next message is required. When processing the next message is required Step S21 is entered; otherwise, Step S30 is entered.

In Step S30, the memory controller 110 may write the ECC chunk comprising the plurality of messages $\{m\}$ and the plurality of parity codes {p} into the NV memory 120. For brevity, similar descriptions for this embodiment are not repeated in detail here.

For better comprehension, the NV memory accessing method may be illustrated with the working flow shown in FIG. 8, but the present invention is not limited thereto. According to some embodiments, one or more steps may be added, deleted, or changed in the working flow shown in FIG. 8.

In addition, S28 may be illustrated in Step S20 shown in FIG. 8 to indicate that the operations of Step S21, S22, . . . , and S28 may be performed for the plurality of messages {m}, respectively, but the present invention is not limited thereto. According to some embodiments, in Step S20, the encoding circuit 200 may process the plurality of messages {m} in a pipeline manner, where a portion of these operations for one of the plurality of messages {m} and a portion of these operations for another (e.g. the next one) of the plurality of messages {m} may be performed at the same time. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile (NV) memory accessing method using data protection with aid of look-ahead processing, the NV memory accessing method being applicable to a memory controller of a memory device, the memory device comprising the memory controller and the NV memory, the NV memory comprising at least one NV memory element, the NV memory accessing method comprising:
   utilizing the memory controller to receive a write command and data corresponding the write command from a host device;
   utilizing an encoding circuit of the memory controller to obtain at least one portion of data within the data corresponding the write command to be a plurality of messages of an error correction code (ECC) chunk, to generate a plurality of parity codes of the ECC chunk according to the plurality of messages through look-ahead type encoding, wherein the plurality of parity codes correspond to the plurality of messages, respectively, for protecting the plurality of messages, respectively, and regarding any message within the plurality of messages, the look-ahead type encoding comprises:
      after a first partial message of the message is sent into the encoding circuit, starting encoding the first partial message to generate a first encoded result;
      after a second partial message of the message is sent into the encoding circuit, applying predetermined input response information to the second partial message to generate a second encoded result, and combining the first encoded result and the second encoded result to generate a first partial parity code of a parity code corresponding to the message; and
      after the message is fully sent into the encoding circuit, starting encoding the message to generate a second partial parity code of the parity code corresponding to the message, and outputting the first partial parity code and the second partial parity code to generate the parity code corresponding to the message; and
   utilizing the memory controller to write the ECC chunk comprising the plurality of messages and the plurality of parity codes into the NV memory.

2. The NV memory accessing method of claim 1, wherein the message comprises a set of message bits; and the first partial message comprises a plurality of beginning bits within the set of message bits, and the second partial message comprises a plurality of remaining bits within the set of message bits.

3. The NV memory accessing method of claim 2, wherein the predetermined input response information comprises a plurality of basis parity codes respectively corresponding to a plurality of bases, and each basis of the plurality of bases comprises a plurality of basis bits; and a bit count of the plurality of remaining bits within the set of message bits and a bit count of the plurality of basis bits are equal to each other.

4. The NV memory accessing method of claim 1, wherein the parity code comprises a set of parity bits; and the first partial parity code comprises a plurality of beginning bits within the set of parity bits, and the second partial parity code comprises a plurality of remaining bits within the set of parity bits.

5. The NV memory accessing method of claim 4, wherein the predetermined input response information comprises a plurality of basis parity codes respectively corresponding to a plurality of bases, and each basis parity code of the plurality of basis parity codes comprises a plurality of basis parity bits; and a bit count of the plurality of beginning bits within the set of parity bits and a bit count of the plurality of basis parity bits are equal to each other.

6. The NV memory accessing method of claim 5, wherein both of a bit count of the first encoded result and a bit count of the second encoded result are equal to the bit count of the plurality of beginning bits within the set of parity bits.

7. The NV memory accessing method of claim 4, wherein both of a bit count of the first encoded result and a bit count of the second encoded result are equal to a bit count of the plurality of beginning bits within the set of parity bits.

8. The NV memory accessing method of claim 1, wherein the predetermined input response information comprises a plurality of basis parity codes respectively corresponding to a plurality of bases; and applying the predetermined input response information to the second partial message to generate the second encoded result comprises:
   multiplying the plurality of basis parity codes by a plurality of bits of the second partial message to generate a plurality of multiplying results, respectively; and
   combining the plurality of multiplying results to generate the second encoded result.

9. The NV memory accessing method of claim 8, wherein:
   multiplying the plurality of basis parity codes by the plurality of bits of the second partial message to generate the plurality of multiplying results respectively comprises:
      performing a plurality of AND operations on the plurality of basis parity codes and the plurality of bits of the second partial message to generate the plurality of multiplying results, respectively; and
   combining the plurality of multiplying results to generate the second encoded result comprises:
      performing a plurality of exclusive-OR (XOR) operations on the plurality of multiplying results to generate the second encoded result;
   wherein through the plurality of AND operations and the plurality of XOR operations, applying the predetermined input response information to the second partial message to generate the second encoded result is completed within a predetermined time after the second partial message is sent into the encoding circuit.

10. The NV memory accessing method of claim 9, wherein:
combining the first encoded result and the second encoded result to generate the first partial parity code of the parity code corresponding to the message comprises:
performing an XOR operation on the first encoded result and the second encoded result to generate the first partial parity code of the parity code;
wherein through the plurality of AND operations, the plurality of XOR operations and the XOR operation, applying the predetermined input response information to the second partial message to generate the second encoded result and combining the first encoded result and the second encoded result to generate the first partial parity code of the parity code corresponding to the message are completed within the predetermined time after the second partial message is sent into the encoding circuit.

11. The NV memory accessing method of claim 10, wherein through the plurality of AND operations, the plurality of XOR operations and the XOR operation, a time of preparing any bit of the first partial parity code is within one clock cycle.

12. The NV memory accessing method of claim 10, wherein through at least one portion of the plurality of AND operations, the plurality of XOR operations and the XOR operation, a time of preparing a first bit of the first partial parity code is within one clock cycle after the second partial message is sent into the encoding circuit.

13. The NV memory accessing method of claim 9, wherein through the plurality of AND operations and the plurality of XOR operations, a time of preparing any bit of the second encoded result is within one clock cycle.

14. The NV memory accessing method of claim 9, wherein through at least one portion of the plurality of AND operations and the plurality of XOR operations, a time of preparing a first bit of the second encoded result is within one clock cycle after the second partial message is sent into the encoding circuit.

15. A memory device, comprising:
a non-volatile (NV) memory, arranged to store information, wherein the NV memory comprises at least one NV memory element; and
a memory controller, coupled to the NV memory, arranged to control operations of the memory device, wherein the memory controller comprises:
a processing circuit, arranged to control the memory controller according to a plurality of host commands from a host device, to allow the host device to access the NV memory through the memory controller; and
a control logic circuit, coupled to the processing circuit, arranged to control the NV memory, wherein the control logic circuit comprises:
an encoding circuit, arranged to perform encoding with aid of look-ahead processing for data protection during accessing the NV memory;
wherein:
the memory controller receives a write command and data corresponding the write command from the host device;
the encoding circuit obtains at least one portion of data within the data corresponding the write command to be a plurality of messages of an error correction code (ECC) chunk, to generate a plurality of parity codes of the ECC chunk according to the plurality of messages through look-ahead type encoding, wherein the plurality of parity codes correspond to the plurality of messages, respectively, for protecting the plurality of messages, respectively, and regarding any message within the plurality of messages, operations of the look-ahead type encoding comprise:
after a first partial message of the message is sent into the encoding circuit, the encoding circuit starts encoding the first partial message to generate a first encoded result;
after a second partial message of the message is sent into the encoding circuit, the encoding circuit applies predetermined input response information to the second partial message to generate a second encoded result, and combines the first encoded result and the second encoded result to generate a first partial parity code of a parity code corresponding to the message; and
after the message is fully sent into the encoding circuit, the encoding circuit starts encoding the message to generate a second partial parity code of the parity code corresponding to the message, and outputs the first partial parity code and the second partial parity code to generate the parity code corresponding to the message; and
the memory controller writes the ECC chunk comprising the plurality of messages and the plurality of parity codes into the NV memory.

16. The memory device of claim 15, wherein the message comprises a set of message bits; and the first partial message comprises a plurality of beginning bits within the set of message bits, and the second partial message comprises a plurality of remaining bits within the set of message bits.

17. The memory device of claim 15, wherein the parity code comprises a set of parity bits; and the first partial parity code comprises a plurality of beginning bits within the set of parity bits, and the second partial parity code comprises a plurality of remaining bits within the set of parity bits.

18. The memory device of claim 15, wherein the predetermined input response information comprises a plurality of basis parity codes respectively corresponding to a plurality of bases; and regarding the encoding circuit applying the predetermined input response information to the second partial message to generate the second encoded result, the encoding circuit multiplies the plurality of basis parity codes by a plurality of bits of the second partial message of the message to generate a plurality of multiplying results, respectively, and combines the plurality of multiplying results to generate the second encoded result.

19. A memory controller of a memory device, the memory device comprising the memory controller and a non-volatile (NV) memory, the NV memory comprising at least one NV memory element, the memory controller comprising:
a processing circuit, arranged to control the memory controller according to a plurality of host commands from a host device, to allow the host device to access the NV memory through the memory controller; and
a control logic circuit, coupled to the processing circuit, arranged to control the NV memory, wherein the control logic circuit comprises:
an encoding circuit, arranged to perform encoding with aid of look-ahead processing for data protection during accessing the NV memory;

wherein:

the memory controller receives a write command and data corresponding the write command from the host device;

the encoding circuit obtains at least one portion of data within the data corresponding the write command to be a plurality of messages of an error correction code (ECC) chunk, to generate a plurality of parity codes of the ECC chunk according to the plurality of messages through look-ahead type encoding, wherein the plurality of parity codes correspond to the plurality of messages, respectively, for protecting the plurality of messages, respectively, and regarding any message within the plurality of messages, operations of the look-ahead type encoding comprise:

after a first partial message of the message is sent into the encoding circuit, the encoding circuit starts encoding the first partial message to generate a first encoded result;

after a second partial message of the message is sent into the encoding circuit, the encoding circuit applies predetermined input response information to the second partial message to generate a second encoded result, and combines the first encoded result and the second encoded result to generate a first partial parity code of a parity code corresponding to the message; and after the message is fully sent into the encoding circuit, the encoding circuit starts encoding the message to generate a second partial parity code of the parity code corresponding to the message, and outputs the first partial parity code and the second partial parity code to generate the parity code corresponding to the message; and the memory controller writes the ECC chunk comprising the plurality of messages and the plurality of parity codes into the NV memory.

20. An encoding circuit of a memory controller of a memory device, the memory device comprising the memory controller and a non-volatile (NV) memory, the memory controller comprising the encoding circuit, the NV memory comprising at least one NV memory element, the encoding circuit comprising:

a control circuit, arranged to control the encoding circuit to perform encoding with aid of look-ahead processing for data protection during accessing the NV memory, wherein the memory controller receives a write command and data corresponding the write command from a host device, and the encoding circuit obtains at least one portion of data within the data corresponding the write command to be a plurality of messages of an error correction code (ECC) chunk, to generate a plurality of parity codes of the ECC chunk according to the plurality of messages through look-ahead type encoding, wherein the plurality of parity codes correspond to the plurality of messages, respectively, for protecting the plurality of messages, respectively;

a message input terminal, arranged to receive any message within the plurality of messages;

a switching circuit, coupled to the message input terminal and the control circuit, arranged to perform switching under control of the control circuit, to divide the message within the plurality of messages into a first partial message and a second partial message;

a first encoder, coupled to the switching circuit, wherein after the first partial message of the message is sent into the encoding circuit, the first encoder starts encoding the first partial message to generate a first encoded result;

a look-ahead circuit, coupled to the switching circuit, wherein after the second partial message of the message is sent into the encoding circuit, the look-ahead circuit applies predetermined input response information to the second partial message to generate a second encoded result;

a combining circuit, coupled to the first encoder and the look-ahead circuit, arranged to combine the first encoded result and the second encoded result to generate a first partial parity code of a parity code corresponding to the message;

a second encoder, coupled to the message input terminal, wherein after the message is fully sent into the encoding circuit, the second encoder starts encoding the message to generate a second partial parity code of the parity code corresponding to the message; and an output circuit, coupled to the combining circuit and the second encoder, wherein under control of the control circuit, the output circuit outputs the first partial parity code and the second partial parity code to generate the parity code corresponding to the message;

wherein the memory controller writes the ECC chunk comprising the plurality of messages and the plurality of parity codes into the NV memory.

\* \* \* \* \*